(12) United States Patent
Park et al.

(10) Patent No.: US 9,570,415 B2
(45) Date of Patent: Feb. 14, 2017

(54) CHIP PACKAGING METHOD AND CHIP PACKAGE USING HYDROPHOBIC SURFACE

(71) Applicant: Korea Advanced Institute of Science and Technology, Daejeon (KR)

(72) Inventors: Hyo Hoon Park, Daejeon (KR); Suk Min Seo, Daejeon (KR); Jong Hun Kim, Daejeon (KR); Sun Kyu Han, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 14/696,171

(22) Filed: Apr. 24, 2015

(65) Prior Publication Data
US 2015/0311177 A1  Oct. 29, 2015

(30) Foreign Application Priority Data

Apr. 25, 2014  (KR) .................. 10-2014-0050298

(51) Int. Cl.
*H01L 23/00*  (2006.01)
*H01L 25/00*  (2006.01)
*H01L 25/065*  (2006.01)

(52) U.S. Cl.
CPC ............. *H01L 24/81* (2013.01); *H01L 24/17* (2013.01); *H01L 25/50* (2013.01); *H01L 24/02* (2013.01); *H01L 24/06* (2013.01); *H01L 24/80* (2013.01); *H01L 25/0657* (2013.01); *H01L 2224/13105* (2013.01); *H01L 2224/13109* (2013.01); *H01L 2224/13111* (2013.01); *H01L 2224/13116* (2013.01); *H01L 2224/16145* (2013.01); *H01L 2224/16227* (2013.01); *H01L 2224/811* (2013.01); *H01L 2224/8102* (2013.01); *H01L 2224/81009* (2013.01);
(Continued)

(58) Field of Classification Search
CPC .......... H01L 24/80; H01L 24/02; H01L 24/06; H01L 2224/16227; H01L 2224/81009; H01L 2224/8102; H01L 2224/81143; H01L 2224/81395; H01L 2224/01801; H01L 2225/06513; H01L 2225/60517; H01L 2225/0652
See application file for complete search history.

(56) References Cited

U.S. PATENT DOCUMENTS 7,687,890 B2 *  3/2010  Subramanian ........... B05D 5/00
                                                    257/629
7,851,344 B2 * 12/2010  Kugler .................. B82Y 20/00
                                                    257/E21.575
(Continued)

*Primary Examiner* — David Zarneke
(74) *Attorney, Agent, or Firm* — Kolisch Hartwell, P.C.

(57) ABSTRACT

A chip packaging method using a hydrophobic surface includes forming superhydrophobic surfaces forming hydrophilic surfaces on predetermined positions of the superhydrophobic surfaces formed on the one of a first chip or the first board and the one of a second chip or a second board, respectively, generating liquid metal balls on the hydrophilic surfaces formed on the one of the first chip or the first board and the one of the second chip or the second board, respectively, and packaging the one of the first chip or the first board and the one of the second chip or the second board by combing the liquid metal ball of the one of the first chip or the first board and the liquid metal ball of the one of the second chip or the second board with each other.

4 Claims, 5 Drawing Sheets

(52) U.S. Cl.
CPC ............... *H01L 2224/8149* (2013.01); *H01L 2224/81143* (2013.01); *H01L 2224/81375* (2013.01); *H01L 2224/81379* (2013.01); *H01L 2224/81395* (2013.01); *H01L 2224/81493* (2013.01); *H01L 2224/81801* (2013.01); *H01L 2225/0652* (2013.01); *H01L 2225/06513* (2013.01); *H01L 2225/06517* (2013.01); *H01L 2924/014* (2013.01); *H01L 2924/0132* (2013.01)

(56) References Cited

U.S. PATENT DOCUMENTS

| | | | | |
|---|---|---|---|---|
| 7,875,503 | B2* | 1/2011 | Gokhale | H01L 21/563 257/783 |
| 8,373,284 | B2* | 2/2013 | Ogatsu | H01L 21/563 257/737 |
| 8,642,931 | B2* | 2/2014 | Stearns | G05D 23/2401 219/490 |
| 2007/0084994 | A1* | 4/2007 | Wang | H01J 49/424 250/282 |
| 2008/0142238 | A1* | 6/2008 | Rawlings | B64D 45/02 174/2 |
| 2010/0248424 | A1* | 9/2010 | Luce | H01L 24/81 438/109 |
| 2011/0031609 | A1* | 2/2011 | Jo | H01L 21/76898 257/692 |
| 2012/0015146 | A1* | 1/2012 | Advincula | B05D 1/202 428/147 |
| 2012/0021563 | A1* | 1/2012 | Koyanagi | H01L 21/6835 438/107 |
| 2012/0028342 | A1* | 2/2012 | Ismagilov | B01L 3/502738 435/283.1 |
| 2012/0044299 | A1* | 2/2012 | Winger | B41J 2/1606 347/54 |
| 2012/0171858 | A1* | 7/2012 | Iwatsu | B23K 1/0016 438/612 |
| 2013/0129978 | A1* | 5/2013 | Varanasi | C23C 4/123 428/141 |

\* cited by examiner

CHIP PACKAGING METHOD AND CHIP PACKAGE USING HYDROPHOBIC SURFACE

CROSS-REFERENCE TO RELATED APPLICATION

This U.S. non-provisional patent application claims priority under 35 U.S.C. §119 to Korean Patent Application No. 10-2014-0050298, filed on Apr. 25, 2014, in the Korean Intellectual Property Office, the disclosure of which is hereby incorporated by reference in its entirety.

BACKGROUND

Embodiments of the inventive concepts relate to a method of packaging a chip using a hydrophobic surface and a chip package formed thereby. More particularly, embodiments of the inventive concepts relate to a technique of packaging chips or boards on which superhydrophobic surfaces and hydrophilic surfaces are formed, respectively.

The terminologies of hydrophobic, superhydrophobic and hydrophilic used herein imply the properties of wettability of such liquid materials as liquid metals and liquid polymers on solid surfaces. These terminologies are used just to lead easy understanding of the characteristics of our invention, based on the well-known wettability property of the surface for water, i.e. 'hydro', and thus not limited to the property for water.

Conventional techniques of packaging chips or boards may mainly use a flip chip bonding technique. According to the flip chip bonding technique, chips or boards may be bonded to each other in such a way that surfaces of electrodes respectively formed on the chips or the boards face each other.

For example, Korean Patent publication No. 2012-0000152 discloses a semiconductor package including a semiconductor chip coupled to a substrate by a conductive bump.

However, in the conventional technique of packaging the chips or boards, an alignment error range of 10 μm or more may occur during a process of bonding the chips or the boards. Thus, a misalignment problem of the chips and/or the boards may be caused.

SUMMARY

Embodiments of the inventive concepts may provide a packaging technique capable of minimizing an alignment error range by automatically aligning chips and/or boards.

Embodiments of the inventive concepts may also provide a chip packaging method capable of automatically aligning chips and/or boards by means of superhydrophobic surfaces and hydrophilic surfaces respectively formed on chips and/or boards, and a chip package formed thereby.

Embodiments of the inventive concepts may also provide a chip packaging method capable of combining chips and/or boards with each other by means of liquid metal balls generated on hydrophilic surfaces, and a chip package formed thereby.

Embodiments of the inventive concepts may also provide a chip-packaging method using surface tension when chips and/or boards are combined with each other by means of liquid metal balls generated on hydrophilic surfaces, and a chip package formed thereby.

In an aspect, a chip packaging method may include: forming superhydrophobic surfaces having predetermined sizes on a surface of one of a first chip or a first board and a surface of one of a second chip or a second board, respectively; forming hydrophilic surfaces on predetermined positions of the superhydrophobic surfaces formed on the one of the first chip or the first board and the one of the second chip or the second board, respectively; generating liquid metal balls on the hydrophilic surfaces formed on the one of the first chip or the first board and the one of the second chip or the second board, respectively; and packaging the one of the first chip or the first board and the one of the second chip or the second board by combing the liquid metal ball of the one of the first chip or the first board and the liquid metal ball of the one of the second chip or the second board with each other.

In another aspect, a chip package may include: one of a first chip or a first board that includes a superhydrophobic surface having a predetermined size and a hydrophilic surface disposed on a predetermined position of the superhydrophobic surface; and one of a second chip or a second board that includes a superhydrophobic surface having a predetermined size and a hydrophilic surface disposed on a predetermined position of the superhydrophobic surface. The one of the first chip or the first board and the one of the second chip or the second board may be packaged by a liquid metal ball generated on the hydrophilic surface disposed on the one of the first chip or the first board and a liquid metal ball generated on the hydrophilic surface disposed on the one of the second chip or the second board.

BRIEF DESCRIPTION OF THE DRAWINGS

The inventive concepts will become more apparent in view of the attached drawings and accompanying detailed description.

DETAILED DESCRIPTION OF THE EMBODIMENTS

A system performing a chip packaging process according to an embodiment of the inventive concepts is defined as a chip packaging system. In addition, the chip packaging process performed between chips will be described as an example. However, the inventive concepts are not limited thereto. In other embodiments, the chip packaging process may be performed between a chip and a board and/or between a board and a board.

Figure 1:
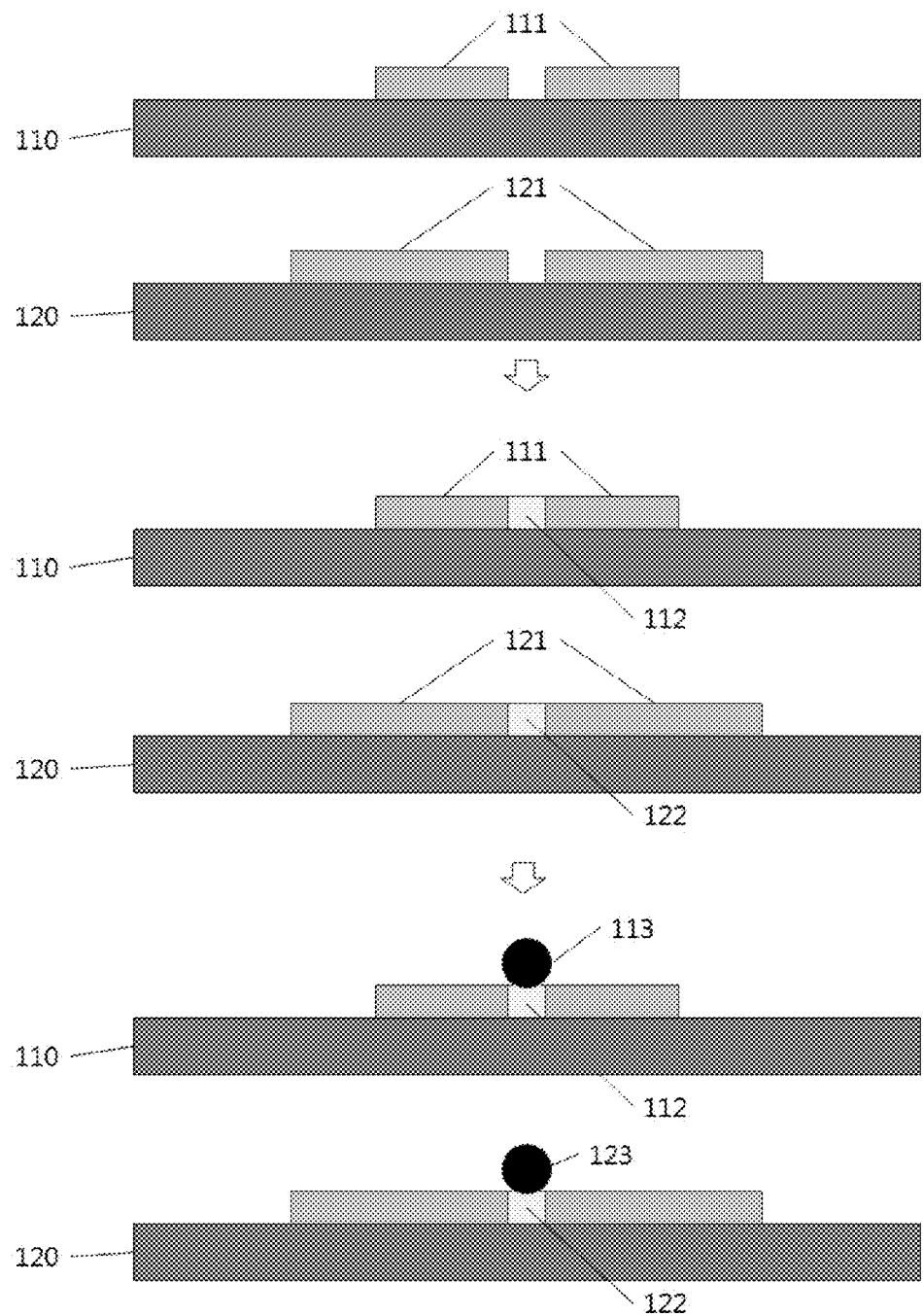
FIG. 1 is a cross-sectional view illustrating a process of forming superhydrophobic surfaces and hydrophilic surfaces on a first chip or first board and a second chip or second board, respectively, according to an embodiment of the inventive concepts.

FIG. 1 is a cross-sectional view illustrating a process of forming superhydrophobic surfaces and hydrophilic surfaces on a first chip or first board and a second chip or second board, respectively, according to an embodiment of the inventive concepts.

Referring to FIG. 1, a chip packaging system according to an embodiment of the inventive concepts may form superhydrophobic surfaces 111 and 121 having predetermined sizes on a surface of a first chip 110 and a surface of a second chip 120, respectively. For example, the chip packaging system may form the superhydrophobic surface 111 of the predetermined size on the surface of the first chip 110 and may form the superhydrophobic surface 121 of the predetermined size on the surface of the second chip 120.

Since hydrophilic surfaces 112 and 122 will be additionally formed on the surfaces of the first and second chips 110 and 120, respectively, the chip packaging system may form the superhydrophobic surface 111 on the surface of the first chip 110 and form the superhydrophobic surface 121 on the surface of the second chip 120 in consideration of positions of the hydrophilic surfaces 112 and 122 to be formed.

Even though not shown in the drawings, the chip packaging system may form the superhydrophobic surfaces 111 and 121 on entire surfaces of the first and second chips 110 and 120, respectively. In this case, the chip packaging system may remove portions, which correspond to positions on which the hydrophilic surfaces 112 and 122 will be formed, of the superhydrophobic surfaces 111 and 121 formed on the entire surfaces of the first and second chips 110 and 120. Subsequently, the chip packaging system may form the hydrophilic surfaces 112 and 122 on corresponding positions, respectively. Alternatively, the portions of the superhydrophobic surfaces 111 and 121 corresponding to the positions of the hydrophilic surfaces 112 and 122 may not be removed, but the hydrophilic surfaces 112 and 122 may be formed to cover the portions of the superhydrophobic surfaces 111 and 121 on the corresponding positions.

Here, the superhydrophobic surfaces 111 and 121 may be formed by a process compatible with a complementary metal-oxide-semiconductor (CMOS) manufacturing process, and thus, an additional process except general semiconductor processes may not be required and a liquid material may move well on the superhydrophobic surfaces 111 and 121 if the liquid material touches the superhydrophobic surfaces 111 and 121. For example, the superhydrophobic surfaces 111 and 121 may be formed of at least one of porous silicon, a carbon nanotube forest, a hydrophobic polymer material, or a wafer irradiated with a short pulse laser.

Next, the chip packaging system may form the hydrophilic surfaces 112 and 122 on predetermined positions of the superhydrophobic surfaces 111 and 121 formed on the first and second chips 110 and 120, respectively. For example, the chip packaging system may form the hydrophilic surface 112 on the predetermined position of the superhydrophobic surface 111 formed on the first chip 110 and may form the hydrophilic surface 122 on the predetermined position of the superhydrophobic surface 121 formed on the second chip 120. For more detailed example, the chip packaging system may form a circular or quadrilateral hydrophilic surface 112 having a predetermined size on the predetermined position of the superhydrophobic surface 111 formed on the first chip 110 and may form a circular or quadrilateral hydrophilic surface 122 having a predetermined size on the predetermined position of the superhydrophobic surface 121 formed on the second chip 120. At this time, the chip packaging system may form the hydrophilic surfaces 112 and 122 having the circular or quadrilateral shapes in order to generate circular liquid metal balls 113 and 123 on the hydrophilic surfaces 112 and 122.

Thereafter, the chip packaging system may generate the liquid metal balls 113 and 123 on the hydrophilic surfaces 112 and 122, respectively. For example, the chip packaging system may respectively form solid metal thin layers on the hydrophilic surfaces 112 and 122 formed on the first and second chips 110 and 120 and may then heat the solid metal thin layers to a temperature equal to or higher than a melting point of a metal of the solid metal thin layers to form the liquid metal balls 113 and 123.

Here, the liquid metal balls 113 and 123 may exist in a liquid state at a predetermined reference temperature and may have a surface tension greater than a predetermined reference surface tension. For example, if a plurality of liquid metal balls are formed on each of the first and second chips 110 and 120, surface tensions of the plurality of liquid metal balls may be set in such a way that a total surface tension of the plurality of liquid metal balls formed on each of the first and second chips 110 and 120 is greater than the reference surface tension required to combine the first chip 110 and the second chip 120 with each other.

In addition, the liquid metal balls 113 and 123 may be formed of at least one of gallium, galinstan, tin, a tin alloy, indium, an indium alloy, an indium-tin (In—Sn) alloy, lead, and a lead alloy, which have low melting points. Thus, the chip packaging system may combine the liquid metal ball 113 formed on the first chip 110 and the liquid metal ball 123 formed on the second chip 120 with each other by their surface tension.

The chip packaging system may package the first chip 110 and the second chip 120 by combining the first chip 110 and the second chip 120, on which the hydrophilic surfaces 112 and 122 and the superhydrophobic surfaces 111 and 121 are respectively formed, with each other. This will be described in detail with reference to FIG. 2.

Figure 2:
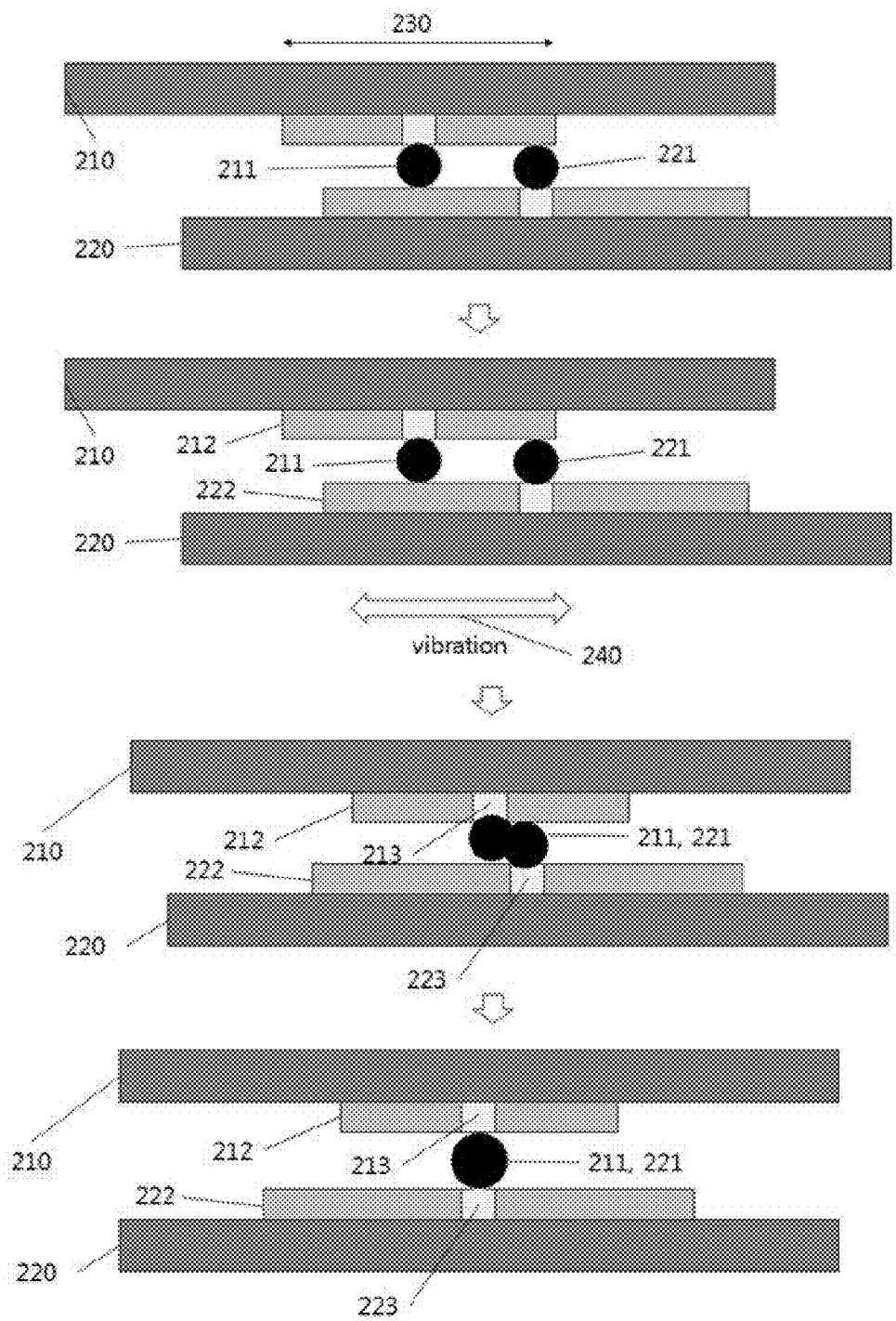
FIG. 2 is a cross-sectional view illustrating a process of packaging a first chip or first board and a second chip or second board according to an embodiment of the inventive concepts.

FIG. 2 is a cross-sectional view illustrating a process of packaging a first chip or first board and a second chip or second board according to an embodiment of the inventive concepts.

Referring to FIG. 2, a chip packaging system according to an embodiment of the inventive concepts may package a first chip 210 and a second chip 220 by combing a liquid metal ball 211 of the first chip 210 and a liquid metal ball 221 of the second chip 220 with each other.

In detail, the chip packaging system may align the first chip 210 and the second chip 220 with each other in such a way that the liquid metal balls 211 and 221 are included in a self-correction range 230 of misalignment. For example, the chip packaging system may turn at least one of the first chip or the second chip of over such that the liquid metal balls respectively formed on the first and second chips of FIG. 1 face each other, and then, the chip packaging system may align the first chip 210 and the second chip 220 with each other such that the liquid metal balls 211 and 221 respectively formed on the first and second chips 210 and 220 are included in the self-correction range 230 of misalignment.

Here, the self-correction range 230 of misalignment may correspond to the superhydrophobic surface. For example, if a width of the superhydrophobic surface 212 of the first chip 210 is equal to a width of the superhydrophobic surface 222 of the second chip 220, the width of one of the superhydrophobic surfaces 212 and 222 of the first and second chips 210 and 220 may correspond to the self-correction range 230 of misalignment. Alternatively, if the width of the superhydrophobic surface 212 of the first chip 210 is different from the width of the superhydrophobic surface 222 of the second chip 220, the smaller of the widths of the superhydrophobic surfaces 212 and 222 of the first and second chips 210 and 220 may correspond to the self-correction range 230 of misalignment. If the liquid metal ball 211 or 221 of an opposite chip is disposed in the self-correction range 230 of misalignment defined above, the self-correction range 230 of misalignment may correspond to a region capable of correcting misalignment by means of horizontal movement of misaligned liquid metal balls 211 and/or 221. Next, the chip packaging system may move at least one of the first chip 210 or the second chip 220 in a horizontal direction to combine the liquid metal ball 211 of the first chip 210 and the liquid metal ball 221 of the second chip 220 with each other (240). For example, the chip packaging system may fix the first chip 210 and may randomly move the second chip 220 by vibrating the second chip 220, so the liquid metal balls 211 and 221 may be combined with each other by their surface tension when the liquid metal ball 221 of the second chip 220 is adjacent to the liquid metal ball 211 of the first chip 210. As a result, the first chip 210 and the second chip 220 may be aligned and combined with each other.

For more detailed example, if at least one of the first chip 210 or the second chip 220 is moved in the horizontal direction (240), the liquid metal ball 211 of the first chip 210 initially aligned in the self-correction range 230 of misalignment may slide on the superhydrophobic surface 222 formed on the second chip 220 and may then come in contact with the liquid metal ball 221 of the second chip 220. Thus, the liquid metal balls 211 and 221 of the first and second chips 210 and 220 may be combined with each other by their surface tension. Likewise, if at least one of the first chip 210 or the second chip 220 is moved in the horizontal direction (240), the liquid metal ball 221 of the second chip 220 initially aligned in the self-correction range 230 of misalignment may slide on the superhydrophobic surface 212 formed on the first chip 210 and may then come in contact with the liquid metal ball 211 of the first chip 220. Thus, the liquid metal balls 211 and 221 of the first and second chips 210 and 220 may be combined with each other by their surface tension.

Next, even though not shown in the drawings, the chip packaging system may reduce the temperature of the liquid metal balls 211 and 221 combined with each other by the surface tension to a temperature lower than the melting point of the metal of the liquid metal balls 211 and 221 or may change a composition of the combined liquid metal balls 211 and 221, and thus, the combined liquid metal balls 211 and 221 may be changed into a solid metal.

As a result, a chip package manufactured by the chip packaging process according to an embodiment of the inventive concepts includes the first chip 210 including the superhydrophobic surface 212 having the predetermined size and the hydrophilic surface 213 disposed on the predetermined position of the superhydrophobic surface 212, and the second chip 220 including the superhydrophobic surface 222 having the predetermined size and the hydrophilic surface 223 disposed on the predetermined position of the superhydrophobic surface 222. Here, the first chip 210 and the second chip 220 are packaged by the liquid metal balls 211 and 221 generated on the hydrophilic surfaces 213 and 223 respectively disposed on the first and second chips 210 and 220. At this time, the liquid metal ball 211 generated on the first chip 210 and the liquid metal ball 221 generated on the second chip 220 may be combined with each other by moving at least one of the first chip 210 or the second chip 220 in the horizontal direction. In addition, the combined liquid metal balls 211 and 221 may be the solid metal.

Figure 3:
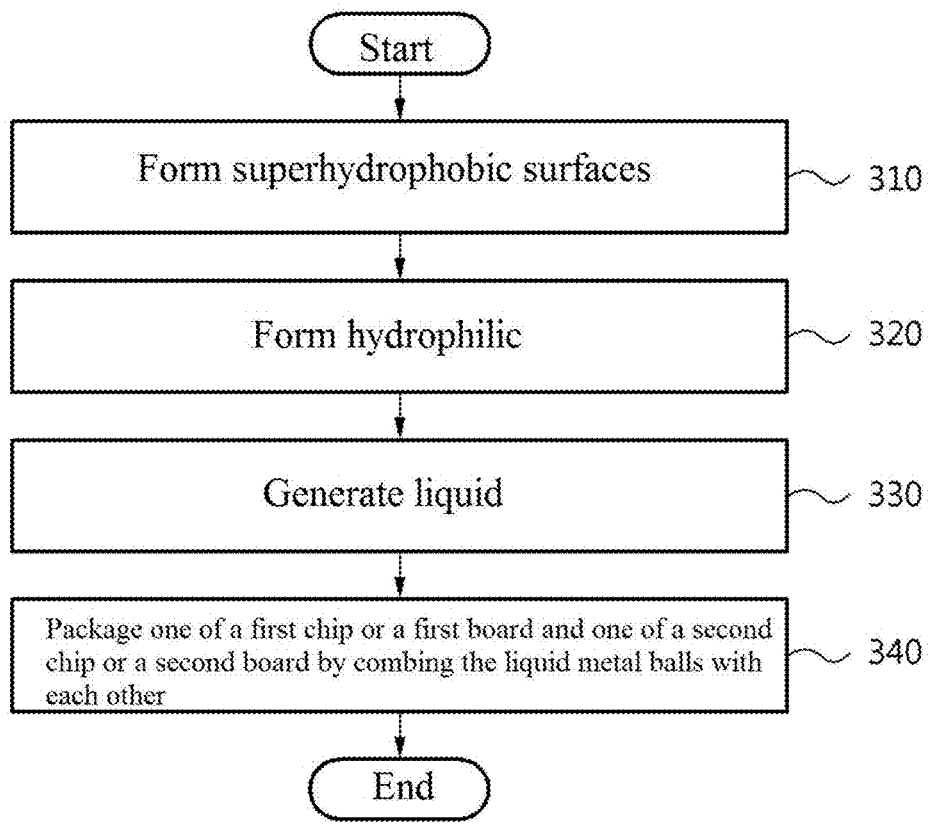
FIG. 3 is a flow chart illustrating a method of packaging a chip using a hydrophobic surface according to an embodiment of the inventive concepts.

FIG. 3 is a flow chart illustrating a method of packaging a chip using a hydrophobic surface according to an embodiment of the inventive concepts.

Referring to FIG. 3, the chip packaging system according to an embodiment of the inventive concepts may form superhydrophobic surfaces having predetermined sizes on a surface of one of a first chip or a first board and a surface of one of a second chip or a second board, respectively (310). Here, the superhydrophobic surfaces may be formed by a process compatible with a conventional semiconductor process, so an additional process for only a packaging process may not be required. For example, the superhydrophobic surfaces may be formed of at least one of porous silicon, a carbon nanotube forest, a hydrophobic polymer material, or a wafer irradiated with a short pulse laser.

Subsequently, the chip packaging system may form hydrophilic surfaces on predetermined positions of the superhydrophobic surfaces formed on the one of the first chip or the first board and the one of the second chip or the second board, respectively (320). At this time, the chip packaging system may form circular or quadrilateral hydrophilic surfaces with predetermined sizes.

Next, the chip packaging system may generate liquid metal balls on the hydrophilic surfaces formed on the one of the first chip or the first board and the one of the second chip or the second board, respectively (330). At this time, the chip packaging system may form solid metal thin layers on the hydrophilic surfaces and may then heat the solid metal thin layers to a temperature equal to or higher than a melting point of a metal of the solid metal thin layers to form the liquid metal balls. Here, the liquid metal balls may exist in a liquid state at a predetermined reference temperature and may have a surface tension greater than a predetermined reference surface tension.

Thereafter, the chip packaging system may package the one of the first chip or the first board and the one of the second chip or the second board by combining the liquid metal ball of the one of the first chip or the first board with the liquid metal ball of the one of the second chip or the second board (340). This will be described in detail with reference to FIG. 4.

Figure 4:
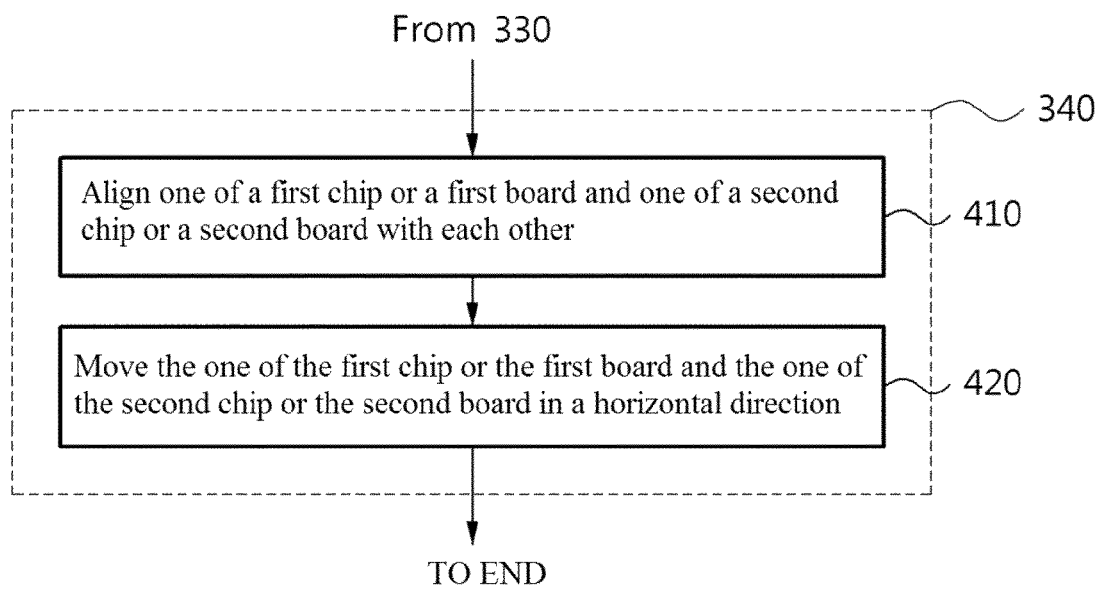
FIG. 4 is a flow chart concretely illustrating a step of packaging a first chip or first board and a second chip or second board by combining liquid metal balls with each other.

FIG. 4 is a flow chart concretely illustrating a step of packaging a first chip or first board and a second chip or second board by combining liquid metal balls with each other.

Referring to FIG. 4, the chip packaging system according to an embodiment of the inventive concepts may align the one of the first chip or the first board and the one of the second chip or the second board with each other such that the liquid metal ball of the one of the first chip or the first board and the liquid metal ball the one of the second chip or the second board are disposed on the superhydrophobic surface corresponding to a self-correction range (410) of misalignment.

Thereafter, the chip packaging system may move the one of the first chip or the first board and the one of the second chip or the second board in a horizontal direction to combine the liquid metal ball of the one of the first chip or the board and the liquid metal ball of the one of the second chip or the second board with each other (420).

For example, the chip packaging system may move the one of the first chip or the first board and the one of the second chip or the second board in the horizontal direction such that the liquid metal ball of the one of the first chip or the board and the liquid metal ball of the one of the second chip or the second board are combined with each other by means of the surface tension of the liquid metal ball of the one of the first chip or the first board and the surface tension of the liquid metal ball of the one of the second chip or the second board.

As described above, the chip packaging system according to an embodiment of the inventive concepts performs the packaging process on the basis of a characteristic that the liquid metal balls generated on the hydrophilic surfaces slide on the superhydrophobic surfaces of the one of the first chip or the first board and the one of the second chip or the second board and are then combined with each other by the surface tension. Thus, an alignment error range may be reduced or minimized.

In addition, even though not illustrated in the drawings, after the liquid metal balls are combined with each other to complete the self-correction process of misalignment, the combined liquid metal balls may be transformed into a solid metal by reducing the temperature of the combined liquid metal balls to a temperature lower than the melting point of the metal or by changing a composition of the combined liquid metal balls. Thus, the chips or boards completely packaged in the packaging process may be firmly maintained.

Figure 5:
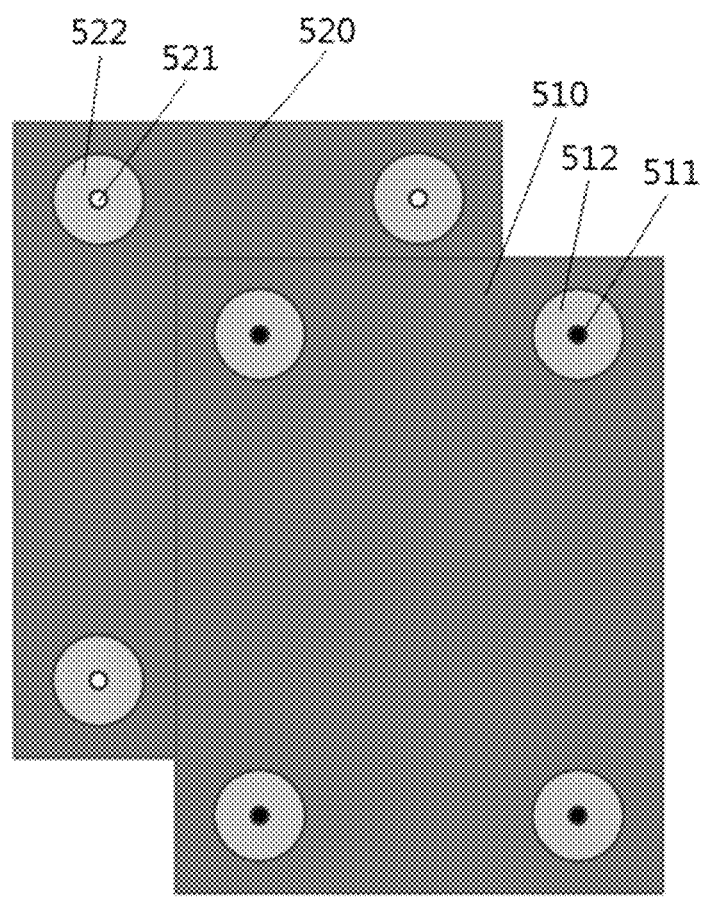
FIG. 5 is a plan view illustrating a chip package using a plurality of liquid metal balls according to another embodiment of the inventive concepts.

FIG. 5 is a plan view illustrating a chip package using a plurality of liquid metal balls according to another embodiment of the inventive concepts.

Referring to FIG. 5, a chip package may have a structure including one or more superhydrophobic surfaces 512 and 522 and liquid metal balls 511 and 521 corresponding thereto in order to self-correct the misalignment in a width direction and a longitudinal direction on each of first and second chips 510 and 520 when viewed from a plan view. Particularly, to self-correct the misalignment in the width direction and the longitudinal direction in a plan view, the superhydrophobic surfaces 512 or 522 may be formed on at least three positions, and a hydrophilic surface and the liquid metal ball 511 or 521 may be formed in each of the superhydrophobic surfaces 512 or 522. At this time, the superhydrophobic surface 512 or 522 may be formed in a circular or quadrilateral shape.

In addition, since a total surface tension of the liquid metal balls 511 and 521 is proportional to sizes (e.g., diameters) of the liquid metal balls 511 and 521 and the number of the liquid metal balls 511 and 521, a plurality of the liquid metal balls 511 and 521 may be used in order that the total surface tension of the liquid metal balls 511 and 521 is equal to or greater than a reference surface tension required to combine the first and second chips 510 and 520 with each other.

Embodiments of the inventive concepts may provide the chip packaging method using the superhydrophobic surfaces and the hydrophilic surfaces respectively formed on the chips or the boards to maximize an auto-alignment error range, and the chip package formed thereby.

Embodiments of the inventive concepts may also provide the chip packaging method combining the chips or the boards with each other by means of the liquid metal balls generated on the hydrophilic surfaces, and the chip package formed thereby.

Embodiments of the inventive concepts may also provide the chip packaging method using the surface tension during the process of combining the chips or the boards by means of the liquid metal balls generated on the hydrophilic surfaces of the chips or the boards, and the chip package formed thereby.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A chip package comprising:
   one of a first chip or a first board that includes a superhydrophobic surface having a predetermined size and a hydrophilic surface disposed on a predetermined position of the superhydrophobic surface; and
   one of a second chip or a second board that includes a superhydrophobic surface having a predetermined size and a hydrophilic surface disposed on a predetermined position of the superhydrophobic surface,
   wherein the one of the first chip or the first board and the one of the second chip or the second board are packaged by a liquid metal ball generated on the hydrophilic surface disposed on the one of the first chip or the first board and a liquid metal ball generated on the hydrophilic surface disposed on the one of the second chip or the second board.

2. The chip package of claim 1, wherein the liquid metal ball generated on the one of the first chip or the first board and the liquid metal ball generated on the one of the second chip or the second board are combined with each other by moving the one of the first chip or the first board and the one of the second chip or the second board in a horizontal direction.

3. The chip package of claim 1, wherein the superhydrophobic surfaces are formed on at least three positions of the one of the first chip or the first board and on at least three positions of the one of the second chip or the second board to self-correct the misalignment in a width direction and a longitudinal direction when viewed from a plan view.

4. The chip package of claim 1, wherein a plurality of the liquid metal balls are used to have a total surface tension equal to or greater than a reference surface tension required to combine the one of the first chip or the first board and the one of the second chip or the second board with each other.

* * * * *